(12) United States Patent
Thomsen et al.

(10) Patent No.: US 6,307,430 B1
(45) Date of Patent: Oct. 23, 2001

(54) NOISE REDUCTION TECHNIQUE IN CHOPPER STABILIZED AMPLIFIER

(75) Inventors: Axel Thomsen; Murari Kejariwal; Prasad Ammisetti, all of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/678,166

(22) Filed: Oct. 2, 2000

(51) Int. Cl.$^7$ ............................................... H03F 1/02
(52) U.S. Cl. ........................................ 330/9; 330/69
(58) Field of Search ............................... 330/9, 51, 69, 330/253; 327/124

(56) References Cited

U.S. PATENT DOCUMENTS

| | | |
|---|---|---|
| 3,638,130 | * 1/1972 | Freeborn ........................ 330/30 D |
| 3,989,961 | 11/1976 | Masreliez . |
| 3,991,730 | 11/1976 | Crall . |
| 4,318,613 | 3/1982 | Waiwood . |
| 4,384,257 | 5/1983 | Nola . |
| 4,429,281 | 1/1984 | Ito . |
| 4,502,020 | 2/1985 | Nelson et al. . |
| 4,509,037 | 4/1985 | Harris . |
| 4,559,502 | 12/1985 | Huijsing . |
| 4,559,634 | 12/1985 | Hochschild . |
| 4,628,279 | 12/1986 | Nelson . |
| 4,713,628 | 12/1987 | Nelson . |
| 4,757,270 | 7/1988 | Rokos . |
| 4,757,275 | 7/1988 | Saller et al. . |
| 4,766,367 | 8/1988 | Saller et al. . |
| 4,780,689 | 10/1988 | Saller et al. . |
| 4,808,942 | 2/1989 | Milkovic . |
| 4,906,944 | 3/1990 | Ferking . |
| 4,924,189 | 5/1990 | Senn et al. . |
| 4,926,178 | 5/1990 | Mallinson . |
| 4,939,516 | 7/1990 | Early . |
| 4,994,805 | 2/1991 | Dedic et al. . |
| 5,012,244 | 4/1991 | Wellard et al. . |
| 5,115,202 | * 5/1992 | Brown ........................ 330/9 |
| 5,298,813 | 3/1994 | Tanigawa et al. . |
| 5,317,277 | 5/1994 | Cavigelli . |
| 5,381,112 | * 1/1995 | Rybicki et al. ................ 330/253 |
| 5,446,405 | 8/1995 | Ikeda . |
| 5,451,901 | 9/1995 | Welland . |
| 5,477,481 | 12/1995 | Kerth . |
| 5,635,871 | 6/1997 | Cavigelli . |
| 5,789,981 | * 8/1998 | Singer et al. ................ 330/253 |
| 5,798,664 | 8/1998 | Nagahori et al. . |

FOREIGN PATENT DOCUMENTS

736968A3    10/1997    (EP) .

* cited by examiner

*Primary Examiner*—Robert Pascal
*Assistant Examiner*—Henry Choe
(74) *Attorney, Agent, or Firm*—Brian C. McCormack; Baker & McKenzie

(57) ABSTRACT

Disclosed is a chopper-stabilized amplifier with current steering used as output switching and to be operated in a low power supply voltage environment.

19 Claims, 12 Drawing Sheets

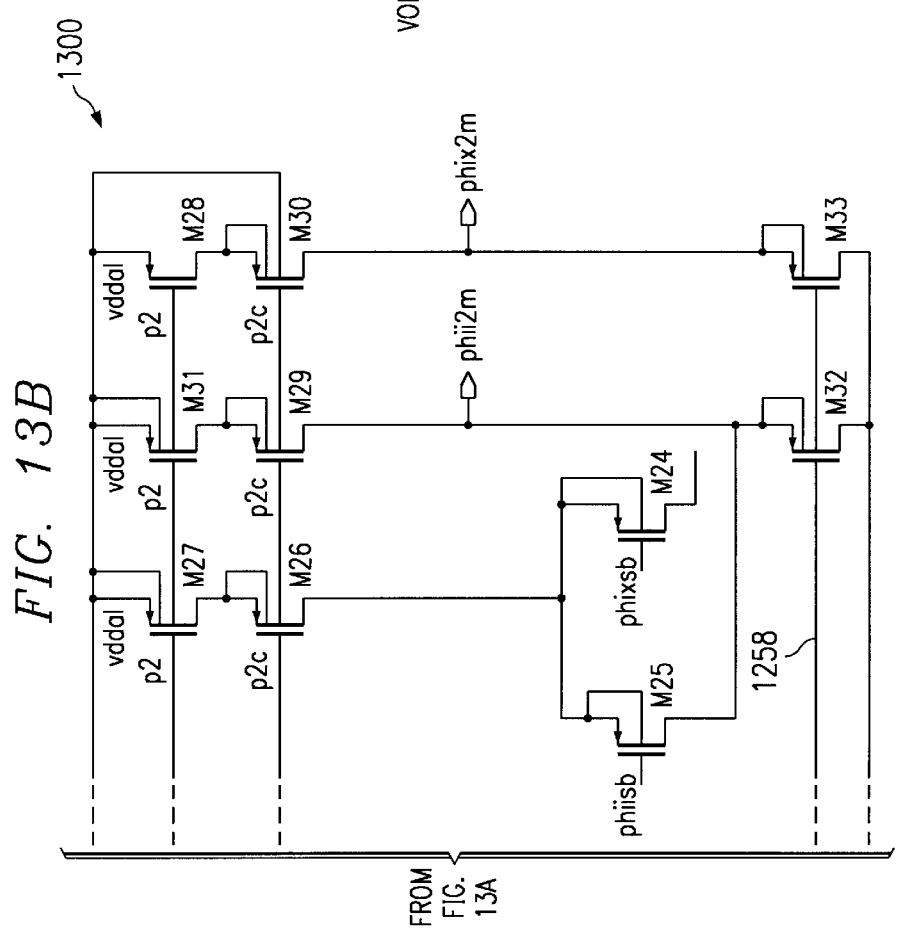

NOISE REDUCTION TECHNIQUE IN CHOPPER STABILIZED AMPLIFIER

RELATED PATENTS AND APPLICATIONS

Related patents and patent applications, which are hereby incorporated by reference herein, include:

U.S. Pat. No. 6,002,299 Filing Date Dec. 14, 1999.

FIELD OF THE INVENTION

This patent application and the embodiments in it relate generally to the field of operational amplifier ("op-amp") circuits. More specifically described herein is a method and circuitry for reducing noise in an op-amp circuit employing chopper stabilization.

SUMMARY

Chopper-stabilized amplifiers have the property of reducing the contribution of random offset voltage and noise, especially 1/f noise. Such circuits operate by modulating the signal to a higher frequency, then sending it to the amplifier, which adds unwanted low-frequency components, then synchronously demodulating the signal and modulating the offset voltage and 1/f noise. This is accomplished by using a biphasic non-overlapping clock, which during one phase enables the input signal to be passed to the amplifier circuit in first orientation and during the other phase allows the input signal to be passed to the operational amplifier in the opposite orientation relative to its inputs. The same biphasic signal is used to synchronize a set of switches at the output of the op-amp circuit in phase with the switching of the input signals at the input to the op-amp circuit.

An op-amp circuit employs feedback to control the closed loop gain of the operational amplifier. This gain is controlled by a current or voltage feedback which adjusts the input current or voltage depending on the output voltage of the circuit. Thus, if there is noise at the output, this noise will be mathematically referred back to the signal input of the amplifier circuit. Since amplifiers are employed to amplify smaller signals into larger ones, it is desirable to have as wide a dynamic range of voltage at the output of the amplifier circuit as possible, but this dynamic range is constrained by the voltage power supply limits for the amplifier circuit itself. For low-voltage systems, in which those power supply voltages may be a range of approximately 3 volts, is contrasted to a higher-voltage system where the voltage range of the amplifier may be in the five-volt range or higher, the dynamic range of the output from the amplifier circuit is limited. It would be possible to compensate for this lower voltage range by employing smaller amplitude signals throughout the system, however, the noise poses an effective lower limit on the amplitude of the signals within the amplifier circuit. Thus, the noise effects an unwanted diminishing of the circuit's dynamic range.

One approach for constructing a high-gain amplifier using transistors is sometimes referred to as a double cascode circuit. The difficulty with the double cascode circuit, especially in a low voltage system, is that there are typically three transistors between the power supply rails and the output of the double cascode amplifier circuit. This reduces the output swing of the amplifier, which is especially important in a low supply voltage application. It is possible to use a gain-boosted cascode amplifier circuit in which two of the transistors are replaced with a single transistor with the gate of the single transistor being fed by another amplifier. This would reduce the number of voltage drops across the transistors from three to two. An amplifier circuit having this gain-boosted cascode circuit relative to both the positive and negative supply rails to the amplifier might be referred to as a folded cascode amplifier using a gain-boosted cascode circuit.

The preferred implementation of the chopper output modulation is by current steering. Relative to a normal folded cascode amplifier, a chopper amplifier using this circuitry would further require switches at the output to properly steer the current through the correct output current path. Embodiments described in this application, however, incorporate the analog clock or biphasic clock used for this switching within the gain-boosted cascode circuit. This is accomplished by adding additional amplifiers to the main folded-cascode amplifier described in the embodiments in this application. This approach uses a single amplifier to provide both the output currents steering and some measure of additional gain for the amplifier circuit.

This chopper-stabilized amplifier circuit preferably has first and second signal inputs, or in other words, is a "differential" amplifier. Within the amplifier are chopper switches, which feed the balanced input signals into balanced input signals for an amplifier portion of the chopper amplifier circuit. These chopper switches periodically reverse the polarity of the signals being applied to the amplifier portion of the chopper amplifier circuit. Within the amplifier portion of the chopper amplifier circuit is a sub-amplifier circuit connected to the positive and negative signal inputs of the amplifier portion. The sub-amplifier circuit has at least one transistor amplifier which is driven by a gain-boosting amplifier. The gain-boosting amplifier preferably provides an output signal which comprises one component that is an amplified signal based on the differential voltage between the positive and negative signal inputs and another component which is a clock signal oscillating over a voltage range that is less than the power supply voltage provided to the transistor amplifier (defined for convenience as "analog clock").

Often there might be further circuitry between the input chopper switches and the inputs to the amplifier portion of the chopper-stabilized amplifier. Also, the clock signal component of said amplified signal is preferably derived from the clock signal that is used to operate the chopper input switches. Within the amplifier sub-circuit, the output voltages are preferably supplied at the drain of the MOS transistor amplifier. That MOS transistor amplifier preferably receives its current from a transistor current source interposed between the source of the MOS transistor amplifier and the power supply. By using the gain-boosted approach described above, the output voltage can be made to swing closer to the supply voltage than would be possible using the double cascode amplifier circuit. Specifically, the output voltage can come within two $V_{DS}$ voltage drops of the supply voltage.

BRIEF DESCRIPTION OF THE DRAWINGS

FIGS. 13A and 13B are a more detailed schematic diagrams of circuitry that may be used to implement the schematic of FIG. 12; and FIG. 14 is a timing diagram showing how the biphasic analog clock signals relate in time to the digital phii clock signal.

DETAILED DESCRIPTION OF THE EMBODIMENTS

Figure 1:
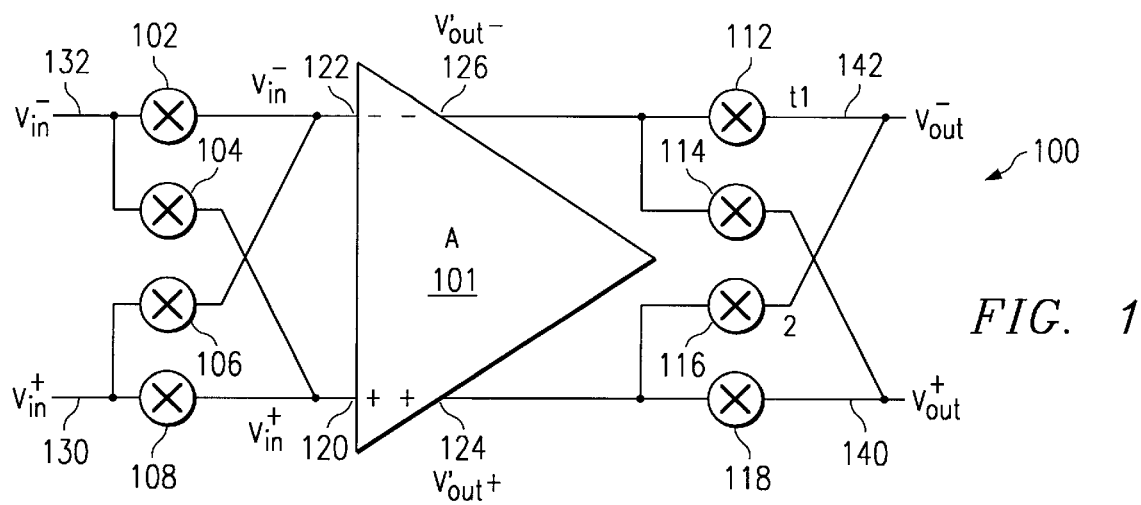
FIG. 1 is a general schematic for a chopper-stabilized amplifier.

Provided in FIG. 1 is a general schematic for a chopper-stabilized amplifier 100. The chopper-stabilized amplifier 100 comprises an amplifier 101, a set of input switches 102, 104, 106, 108, and a set of output switches 112, 114, 116, 118. The amplifier 101 is a balanced amplifier having two inputs 130, 132 and two outputs 140, 142. A balanced amplifier operates by amplifier the voltage difference between the inputs $V'_{in}+120$ and $V'_{in}-122$ at the balanced output of the amplifier $V'_{out}+124$ relative to $V'_{out}-126$. A chopper-stabilized amplifier operates by periodically switching the polarization of the inputs and outputs to the amplifier 101. As a part of that polarization switching, the outputs are switched in phase with the inputs, such that when a first pair of input switches 102, 108 are passing through the input signal, a matching pair of output switches 112, 118 are passing through the output signal.

The turning "on" and "off" of input and output switches in a chopper-stabilized amplifier is synchronized to keep the signal at the input ($V_{in}+130$, $V_{in}-132$) and output nodes ($V_{out}+140$, $V_{out}-142$) to the chopper-stabilized amplifier 100 in phase while periodically reversing the flow of signal through the amplifier 101. For example, during one phase of a clock, the first pairs of input switches 102, 108 and output switches 112, 118 are "ON" and the second pairs of input switches 104, 106 and output switches 114, 116 are "OFF"; during the other phase of the clock, the opposite is true. A chopper-stabilized amplifier 100 has the property of reducing the contribution of random offset voltage and noise, especially 1/f noise.

Figure 2:
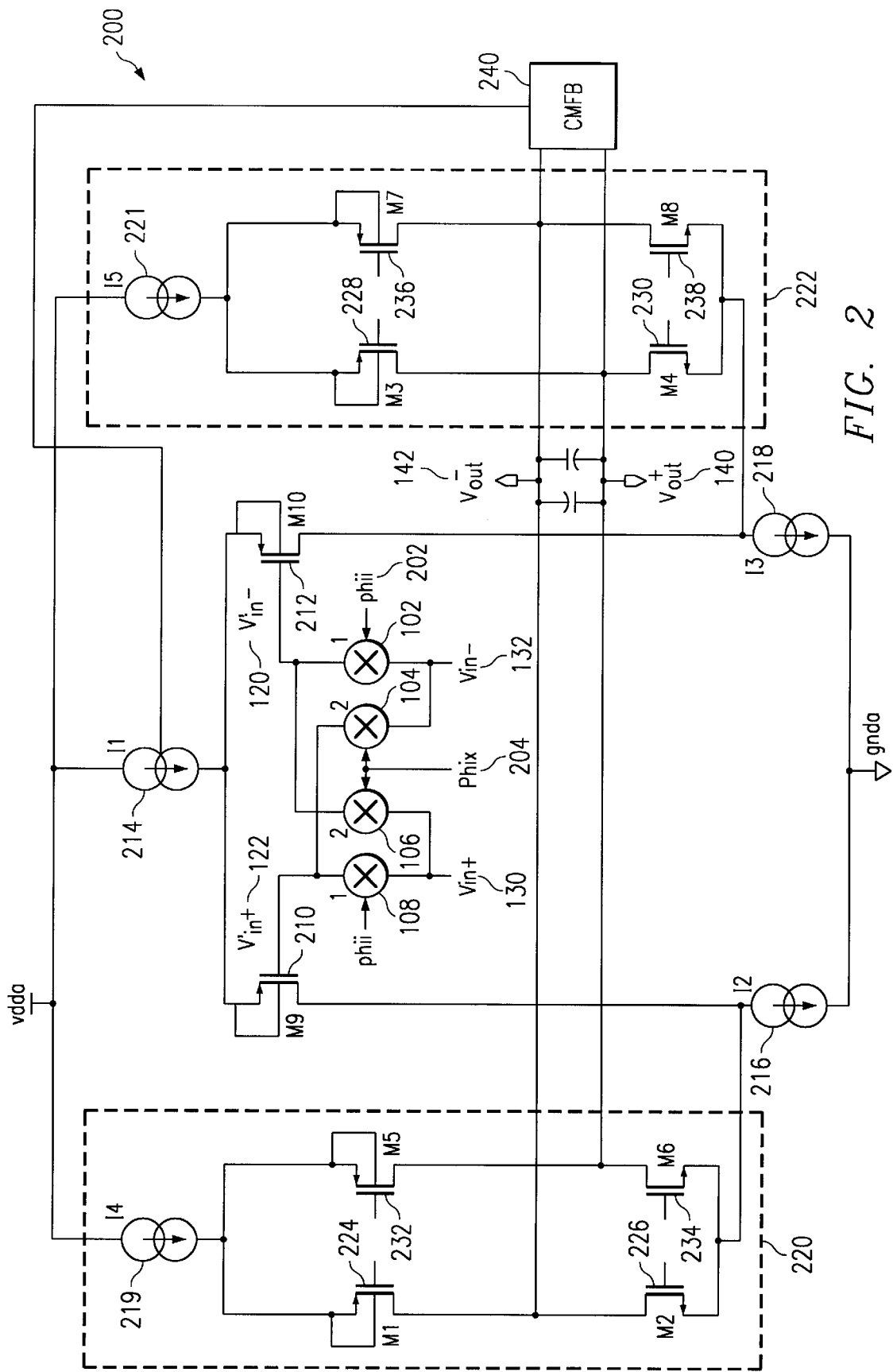
FIG. 2 is a more-detailed diagram of an embodiment for a chopper-stabilized amplifier, using current steering at the output.

FIG. 2 provides a more-detailed diagram of an embodiment for a chopper-stabilized amplifier such as described in FIG. 1. The diagram of FIG. 2 provides both specific schematic portions, as well as block representations of certain circuit elements within the device. Specifically, the $V_{in}+$ and $V_{in}-$ signals 130, 132 can be seen feeding into the input chopper switches 102, 104, 106, 108. In this figure, however, the biphasic clock is shown as the phii and phix signals 202, 204. As can be seen, the phii clock signal feeds into the first pair of switches 102, 108, whereas the phix clock signal feeds into the second pair of input chopper switches 106. As before in FIG. 1, the outputs of these sets of chopper signals which feed into the amplifier 101 (not shown, see FIG. 1) are the $V'_{in}+$ and $V'_{in}-$ signals 120, 122. At the inputs $V'_{in}+$ and $V'_{in}-$, there are provided transistor amplifiers M9 and M10 (210 and 212), which operate in coordination with the current sources I1, I2, and I3 (214, 216, and 218, respectively) to provide signals to the folded cascode amplifier output circuits 220 and 222.

The function of output switches SWout1 220, 222 of FIG. 1 is performed by transistors M 224, M2 226, M3 228, and M4 230 in FIG. 2, while the function of output switches SWout2 is performed by transistors M5 232, M6 234, M7 236, and M8 238. Transistors M1 224, M3 228, M5 232, and M7 236 are p-channel devices, while transistors M2 226, M4 230, M6 234, and M8 238 are n-channel devices. An n-channel transistor can be turned on by applying high state of a clock signal while the p-channel transistor is turned on by a low state of a clock signal. Transistors M2, M4, M6, and M8 are conducting current when the clock signals applied to their gate terminals are high; transistors M1, M3, M5, and M7 are conducting when the clock signals applied to their gate terminals are low. So that both polarities of the clock signal are to be applied to the n-channel and p-channel devices simultaneously, the "complement" or opposite polarity of the phii 202 and phix 204 clock signals are also provided to the circuit shown in FIG. 2. As can be seen, the phii and phix clock signals (202, 204) are provided to the n-channel devices, while the complementary phiib and phixb clock signals (206, 208) are simultaneously provided to the p-channel devices.

Also provided in FIG. 2 is a Common Mode Feedback circuit ("CMFB") 240 that receives the amplified outputs 140, 142 of the circuit and senses common-mode signal that may be present. Common-mode signal is the signal that is present on both the positive and negative sides of the output signal. The CMFB circuit 240 provides a feedback signal to the current source I1 (214) to modulate the current flow through the amplifier circuit as a whole to thereby accommodate the effects of the common-mode signal.

Figure 3:
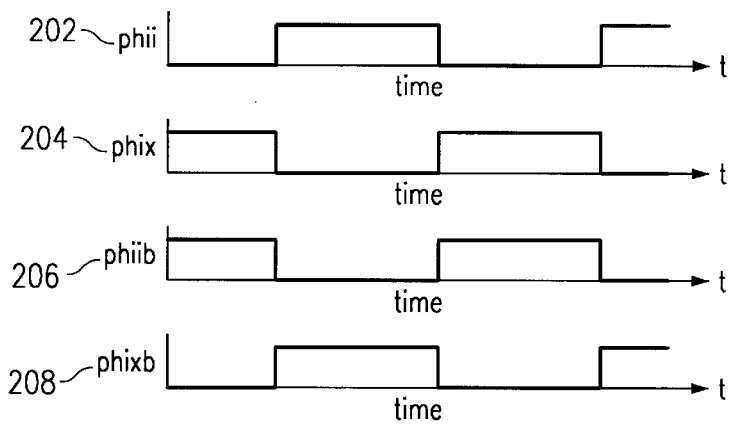
FIG. 3 is a timing diagram of the relationship between the non-overlapping clocks used for the current steering in the chopper amplifier.

The time relationship between the clocks is shown in one example in the timing diagram of FIG. 3. Clocks phii 202 and phix 204 are nonoverlapping clocks. Clock Ohio phiib 206 is preferably the complement of clock phii 202 and clock phixb 208 is preferably the complement of clock phix 204.

Figure 4:
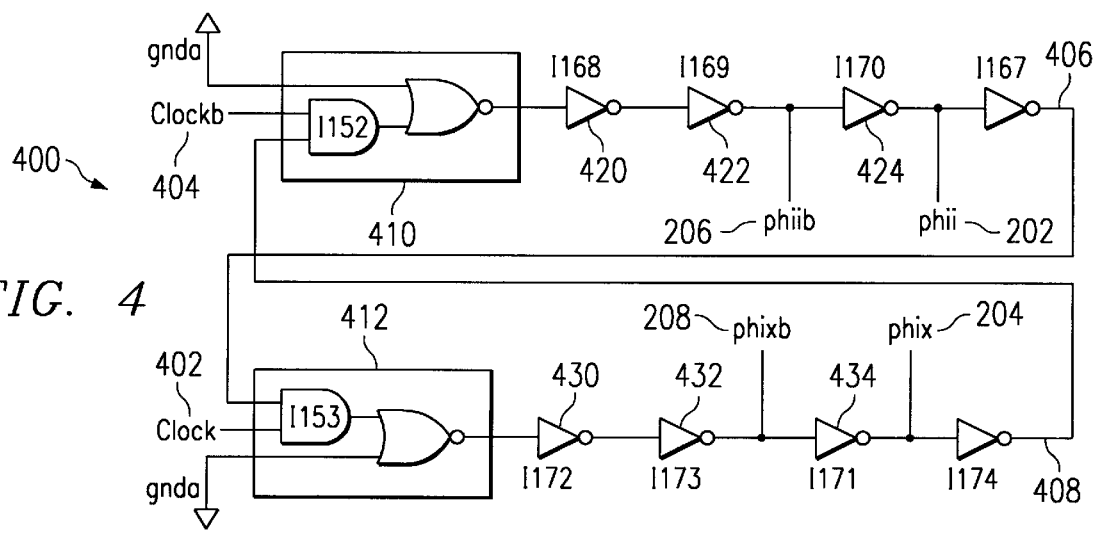
FIG. 4 is a diagram of circuitry that can be used to generate these non-overlapping clocks.

The clock circuit 400 of FIG. 4 provides the non-overlapping clocks and other clocks needed for operation of the chopper-stabilized amplifier 100 from a master clock 402. "Clock" 402 is the master signal. "Clockb" 404 is its complement.

Still referring to FIG. 4, inverters 420 and 422 condition the input "clockb" signal 404 and provide current amplification to drive the phiib clock signal 206. As mentioned, phii 202 and phiib 206 are complements of each other, which follows from the inverter 424 between them. The inverter 424 also preferably provides sufficient current to drive the phii clock signal 204. Similarly, inverters 430 and 432 condition the input "clock" signal 402 to provide the phixb clock signal 208. Inverter 434 provides that the phix clock signal 204 will be the complement of the phixb clock signal 208. The outputs 406, 408 of the two arms of this circuit are cross-coupled to the input gates 410, 412 in order to produce non-overlapping clock signals.

Figure 5:
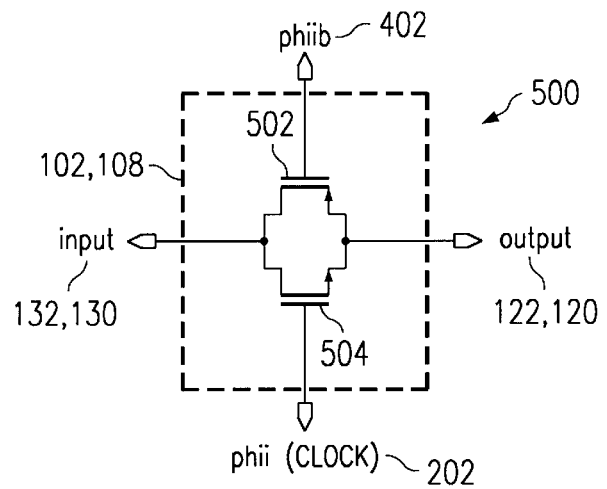
FIG. 5 is a schematic diagram of circuitry that can be used to realize chopper switches in a chopper-stabilized amplifier.

FIG. 5 shows a Tgate implementation 500 of the input chopper switches which can be used in the described chopper-stabilized amplifier embodiments. The Tgate switch 500 of FIG. 5 is preferably implemented by using an n-channel transistor 502 connected in parallel to a p-channel transistor 504. The n-channel transistor 502 is driven by the phiib clock signal 402 and the p-channel transistor 504 is driven by the phii clock signal 202. By this configuration, efficient pass-through switches 102, 108 can be provided as in the circuit of FIG. 1 for steering the input signals Vin$^-$ 132 and Vin$^+$ 130 to the appropriate amplifier inputs V'$_{in}$+120 and V'$_{in}$−122. Switches 102, 108 for example would be closed when the phii signal 202 is high and its complement, phiib 402, is low. The switches 102, 108 would be opened, on the other hand, when the phii signal 202 is low and its complement, phiib 402, is high.

The other input chopper switches 104, 106 are configured opposite from those of FIG. 5, in other words, the same input and output signals are provided, but for switches 104, 106, the phix clock signal 204 is provided to the gate of the n-channel transistor 502 whereas the phixb clock signal 401 is provided to the gate of the p-channel transistor. Thus, the operation of the switches 104, 106 is such that these switches are open while switches 102, 108 are closed and they are closed while switches 102, 108 are open. Through the opposite operation of these switches, the signal flow to the balanced inputs of the amplifier 101 are reversed with the toggling of the phii and phiib clock signals 202, 402.

Figure 6:
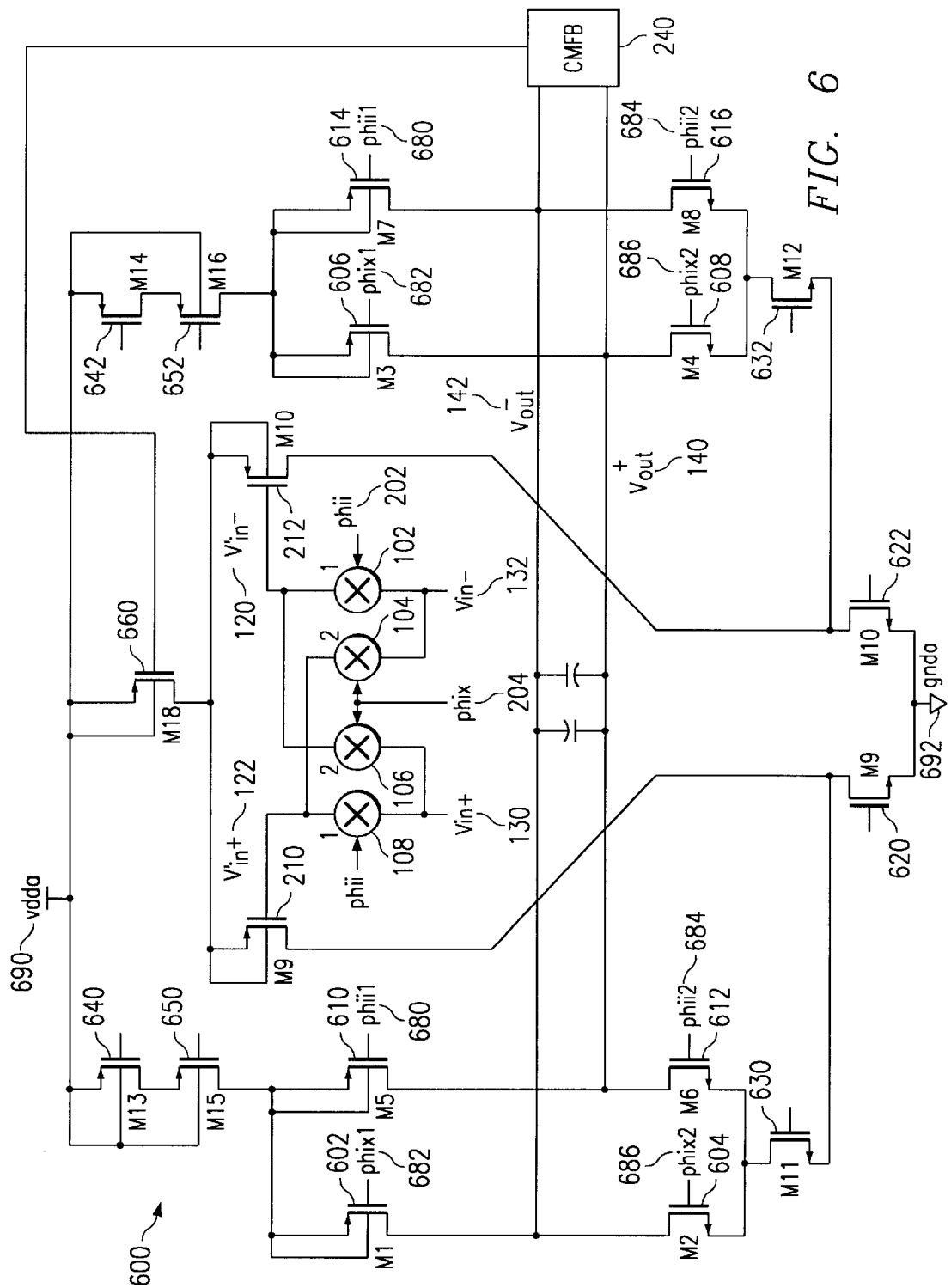
FIG. 6 is a more detailed schematic diagram of circuitry that might be used to implement the embodiments of FIG. 1 and FIG. 2.

FIG. 6 shows circuitry for an embodiment of FIG. 1 and FIG. 2 in still-greater detail. The circuitry of FIG. 6 illustrates what can be described as a folded double cascode amplifier with current-steering, output-chopper switches 600. The transistors M1–M8 (602, 604, 606, 608, 610, 612, 614, 616) have dual functions, which are to (i) act as output chopper switches by steering currents in the desired fold of the chopper amplifier circuit 100 and (ii) act as cascode transistors of the folded-cascode amplifier 100, to boost the voltage gain. Also provided in FIG. 6 is a Common Mode Feedback circuit ("CMFB") 240 that receives the amplified outputs 140,142 of the circuit and senses common-mode signal that may be present. The CMFB circuit 240 then provides a feedback signal to gate of the current source transistor M18 660 in order to modulate the current flow through the circuit as a whole to accommodate the effects of the common-mode signal.

The transistors M1–M8 are preferably operated in their linear regions and accordingly need an analog clock signal which has a voltage swing that remains within the voltages being switched by these transistors, i.e., a voltage swing within some sub-portion of the analog supply rails Vdda and gnda (690, 692). For example, in a 5-volt system, the clock signals for phii, phix, phiib, and phixb (202, 204, 206, 208) swing between 0 and 5 volts. To operate the M1–M8 transistors within their amplifying range, these clock signals must be stepped down to well within the range of the power supply voltages (0 and 5 volts). For example, the phii1 and phix1 clock signals (680,682) are provided to the base of transistors M1,M3,M5, M7, swinging between 3.2 and 4.0 volts. The voltage swing for phii2 and phix2 (684,686), which are provided to transistors M2,M4,M6,M8, may correspondingly be 1.0 to 1.8 volts. An exemplary circuit for is providing these analog clock signals 680,682,684,686 is shown as a portion of the circuitry of FIG. 7.

Still referring to FIG. 6, this circuit uses a double cascode approach where the pair of transistors M9, M10 620, 622 forms the first stage of the cascode, where transistors M11, M12 630, 632 form the second stage of the cascode, and where transistors M2, M6 604, 612 and M4, M8 608, 616 form the third stage of the double cascode. At the first stage, a bias voltage n2 is applied to the gate of each of these n-channel devices. At the second stage, a bias voltage n2 is applied to the gates of the n-channel cascode devices M11, M12 630, 632. The transistor pairs M2, M6 604, 612 and M4, M8 608, 616 serve a dual function as both a third stage to the cascode function as well as the output chopping switches. The clock signals driving these gates are named phii2 and phix2 to differentiate them from the phii and phix signals.

The upper portion of the circuit comprised of M1, M3, M5, M7, M13, M14, M15, and M16 operate as a mirror image of the lower portion of the circuit that has just been described. Like with the n2 and n2c signals which are the bias voltages for the n-channel devices, the p2 and p2c signals are bias voltages for the p-channel devices in the upper mirrored portion of the circuit. Similarly, the phix1 and phii1 signals perform the same operation to serve as the analog clock signals to the output chopper transistor pairs M1, M5 602, 610 and M3, M7 606, 614.

Like the phii and phix signals were non-overlapping clock signals, but were digital, the phii1, phii2, phix1, and phix2 signals are non-overlapping clock signals, but these signals are analog signals which switch between two voltage levels that are within the supply rails to the digital circuit. By operating the transistor pairs M2, M6 and M4, M8 with their gate voltages in the region between the supply rails, these transistors can be made to operate as amplifiers as well as switching transistors thereby further increasing the overall gain of the amplifier circuit. The same principle applies to the upper mirrored ails portion of the circuit, which comprises the p-channel transistors.

Figure 7:
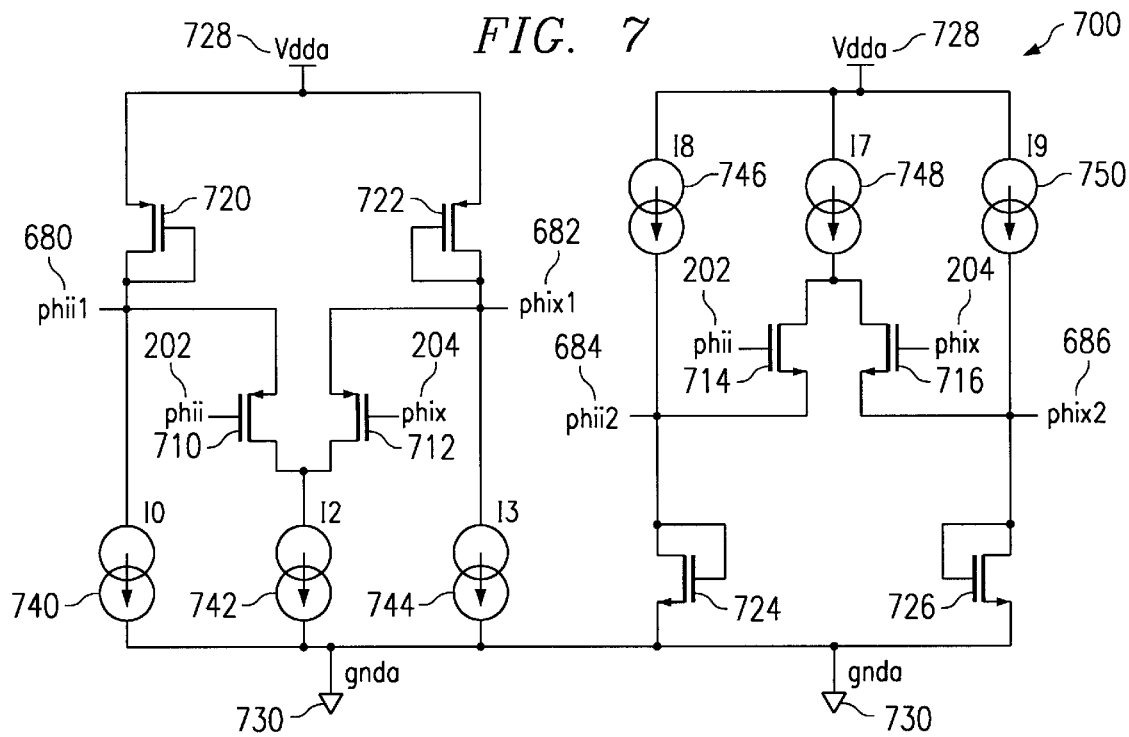
FIG. 7 is a schematic diagram of circuitry that can be used to generate an analog clock which may allow the transistors in FIG. 6 to act both as output chopper switches and as current steering transistors for the folded cascode amplifier.

FIG. 7 illustrates the circuitry 700 for generating the analog clock signals phii1, phix1, phii2, and phix2 (680, 682,684,686). FIG. 7 provides an embodiment of the circuitry for generating the analog clocks phii1 680, phix1 682, phii2 684, and phix2 686 from the normal digital clock signals phii 202 and phix 204. The phii1 680 voltage, for instance, is modulated by the rising and falling of the phii signal 202, which serves to turn off or turn on the transistor 710. When transistor 710 is "on," this makes a current path through I2 (742) and parallel with the I0 (740) current path. The currents from these to paths will be additive, and therefore, the IR drop across the active load 720 will be increased. When transistor 710 is "off", only the I0 current will pass through the active load transistor 720.

The voltages that will be seen on the analog clock signals can be shown by the following example for phii1. The phii1 voltage when transistor 710 is off (phii=1) will be Vdda−I0*R$_{720}$, where R$_{720}$ is the resistance of transistor 720 with current I0 flowing through it. This voltage can be set by adjusting the value of the current source I0. When phii goes low, turning transistor 710 on, the current through the transistor 720 increases to I0+I2. Note that essentially none of the I2 current will pass through the other portion of the analog clock circuit during this time because the phii and phix signals are 180 degrees out of phase. When the transistor 710 is "on," the transistor 712 will be "off." I2 can be adjusted to give the desired voltage during the phii low state.

That voltage will be Vdda−(I0+I2)*R'$_{720}$, where R'$_{720}$ is the resistance of transistor 720 with I0+I2 flowing through it. The desired analog voltages of all the analog clocks can be set in a similar matter by adjusting the values of the current sources I0, I2, I3, I4, I5, and I6 (740, 742, 744, 746, 748, 750), knowing that each transistor 720, 722, 724, 726 will have a certain voltage drop from its drain to source depending on the current flowing through that transistor.

Essentially, the analog clock generation circuit 700 modulates the clock signals at chosen interim median voltages between the Vdda and gnda voltage levels.

FIG. 14 shows a timing diagram and the relationship of two of the exemplary analog clock signals in relation to the phii clock signal 202. Note that the phii1 680 signal is 180 degrees out of phase with the phii signal 202 and oscillates between a voltage of approximately ⅔ to ¾ of the maximum phii signal value, whereas the phii2 signal is in phase with the phii signal 202 and oscillates between a voltage of approximately ¼ to ⅓ of the maximum phii signal value. These "stepped" analog clock signals phii1, phix1, phii2, phix2 can be used to drive the gate of the cascode transistors M1–M8 shown in FIG. 6, and the appropriate voltage level can be chosen for each of these signals depending on the appropriate phase for their operation and their relative position to Vdda 690 or gnda 692. For example, the higher relative voltages phii1 and phix1 (680, 682) would be preferably used to drive the cascode transistors M1, M3, M5, M7 operating on the upper half of the mirrored cascode, and thus closest to the Vdda signal 690, whereas the lower-relative voltages phii2 and phix2 (684, 686) can be used to drive the cascode transistors operating on the lower half of the mirrored cascode and thus closest the gnda signal 692.

Referring again to FIG. 6, an advantage of the folded cascode amplifier 600 shown in this figure is its relatively-high gain. But the difficulty with this folded cascode approach is that the output signals of the implemented circuit suffers several V$_{DS}$ voltage drops between the voltage supply rails and the outputs V$_{out}$+140 and V$_{out}$−142, thereby limiting the maximum output voltages and accordingly limiting the minimum required vdda 690 voltage. For example, to output a high signal on V$_{out}$−142, depending on the clock phase, the current from Vdda must pass through transistors M7, M17, and M14 or M1, M15, and M13. When operating on a 2.7 volt system, all or almost all of the possible supply voltage is expended through voltage drops across the three serial transistor V$_{DS}$'s. To output a low signal on Vout−142 would similarly require current passing through three transistors (e.g., through M9, M11, and M2 or M10, M12, and M8). As a more-specific example, when current is flowing through the M4 transistor 608, the closest the voltage of the V$_{out}$+signal 140 could reach to gnda 692 would be: gnda +V$_{DS\ (M10)}$+V$_{DS\ (M12)}$+V$_{DS(M4)}$. Similarly, if there is a current path flowing through the M7 transistor, the closest the V$_{out}$−signal 142 could be to the Vdda reference voltage would be: Vdda−V$_{DS\ (M14)}$−V$_{DS\ (M16)}$−V$_{DS\ (M7)}$.

For a lower supply voltage circuit, one would be inclined to use the cascode device for current steering, but it should be noted that the 1/f noise of the current steering transistor is not removed—it is suppressed by a smaller factor than in the double cascode case, and is therefore insufficient to meet the noise target.

Figure 8:
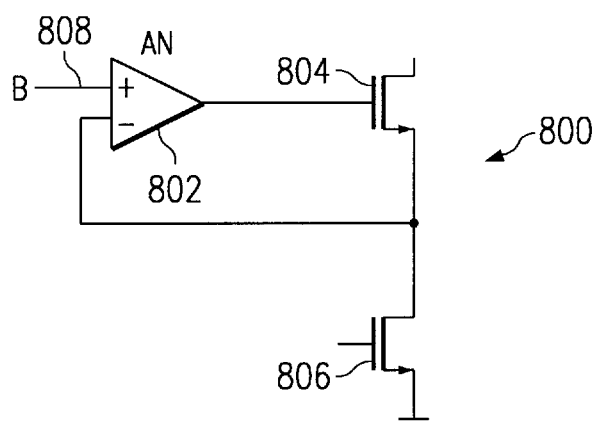
FIG. 8 is a schematic diagram of a gain-boosted cascode circuit.

As shown in FIG. 8, it is possible to substitute the three-stacked transistor devices of the double cascode amplifier 600 by using a gain-boosted cascode circuit 800 as shown in FIG. 8. The gain-boosted approach uses an amplifier A$_n$ 802 to drive the gate of the cascode device 804, while the load device 806 remains at essentially the same place as in the double cascode amplifier of FIG. 6. This load device 806 as shown in FIG. 8 corresponds with the M9, M10, M13, and M14 devices shown in FIG. 6. The combination of the amplifier An 802 with its fixed bias voltage input B along with the cascode transistor 804 serves to replace the combination of, depending upon which current path is selected, the M12 and M8 transistors, or the M12 and M4 transistors, or the M11 and M2 transistors, or the M11 and M6 transistors, and their mirrored combinations on the p-side of the double cascode amplifier 600. In this way, the current drop from the supply rails to the output circuits is limited to the drain-to-source voltage drops across only two transistors, rather than the three transistors that were described for the double cascode amplifier 600.

Figure 8A:
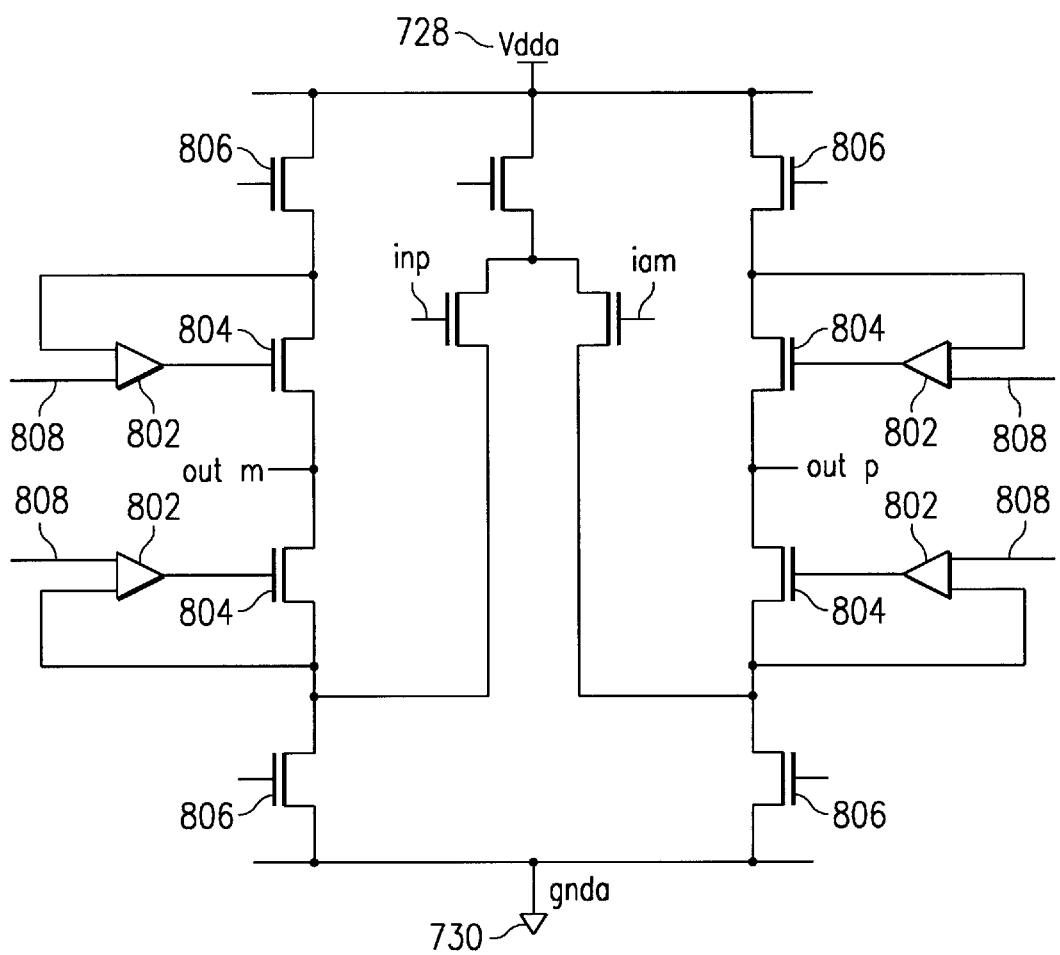
FIG. 8A is a schematic diagram in which the circuitry of a double cascode amplifier is replaced with a gain-boosted cascode amplifier circuit.

FIG. 8A provides a general schematic diagram of how this gain-boosted cascode circuit 800 can be implemented to address the problem of three V$_{DS}$ voltage drops in the double cascode amplifier circuit 600. As can be seen, the output signals of the gain-boosted cascode circuit 800 are separate from the analog voltage supply rails 728, 730 in this circuit by only two V$_{DS}$ voltage drops.

Figure 9:
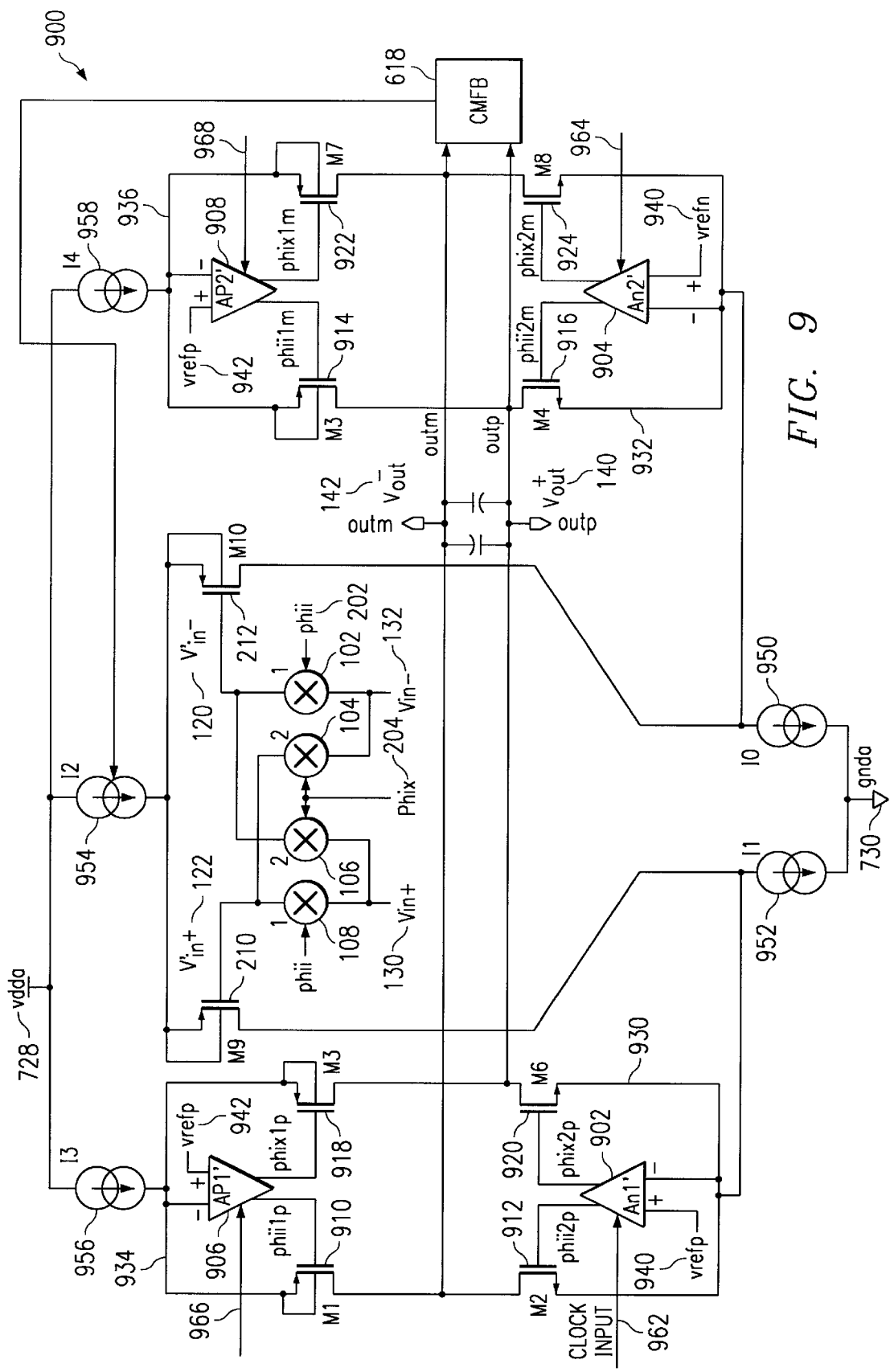
FIG. 9 is schematic diagram of a folded-cascode amplifier in which both current steering and amplification is provided in its output transistors.

The embodiment of FIG. 9 increases voltage gain of the folded cascode amplifier by using a gain-boosted cascode circuit and incorporating an analog clock generation circuit to drive the output current steering transistor switches M1–M8 (910, 912, 914, 916, 918, 920, 922, 924) for further gain, thereby reducing the input-referred noise. This is accomplished by adding four amplifiers in the main folded-cascode amplifier as shown in FIG. 9. The functions of the amplifiers An1', An2', Ap1' and Ap2' (902, 904, 906, 908) are similar. For example, in An1', one of the inputs (+) is connected to a reference voltage, Vrefn 940, and the second input (−) is connected to the fold node, nop 930. The output of An1' controls the output chopper or current-steering switches, in this case n-channel Transistors M2 and M6 (912, 920)—turning on one of these two transistors depending upon the clock phase. The amplifier An1' tries to maintain equal voltages at the input terminals (−and +). Therefore, the voltage at node nop 930 is maintained at Vrefn 940, which translates into a high impedance at the output nodes outp and outm, thus increasing voltage gain. High voltage gain reduces the input-referred noise contribution of chopper switches M2 and M6.

Thus, the amplifier An1' serves as a sub-circuit to the current-steering amplifier circuit comprised collectively of An1', M2, and M6. Amplifier An1' receives at least a signal input at node nop 930 and a clock input 962. The amplifier An1' in turn generates first and second output signals, each output signal including a clock component based on said clock signal input. The transistors M2 and M6 each serve as other sub-circuits to the current-steering amplifier circuit. On the one hand, M2 will receive one output signal from An1', and based on the phase of the clock component, M2 will either be turned "off," which means it will present a substantially open circuit to the remainder of the circuitry and thus will conduct little or no current, or it will be "on." When "on," M2 and An1' will collectively form a gain-boosted cascode amplifier. On the other hand, M6 will receive the other output signal from An1', which will also have a clock component which will be substantially non-overlapping (approximately 180 degrees out of phase) with the clock component on the first output signal from An1'. M6 will accordingly be "off" when M2 is "on" and "on" when M2 is "off." During the times that M6 is "on," An1' and M6 will collectively act as a gain-boosted cascode amplifier.

As mentioned, the other amplifiers (An2', Ap1', Ap2') operate in a similar fashion with their associated transistor amplifiers, and the operation of the amplifiers will be coordinated to such that the output signals will be appropriated steered in unison with the input chopping.

Through use of the FIG. 9 circuitry, a folded cascode amplifier approach is achieved, but the $V_{DS}$ voltage drops between the outputs (Vout+140, Vout−142) and the analog power supply rails (Vdda 728, gnda 730) is reduced from three to two. The figure of "two" VDS drops comes from assuming an implementation of the current sources I0–I4 (950, 952, 954, 956, 958) as transistors with their gates tied to reference voltages as shown in FIG. 6 (see also FIG. 10).

Figure 10:
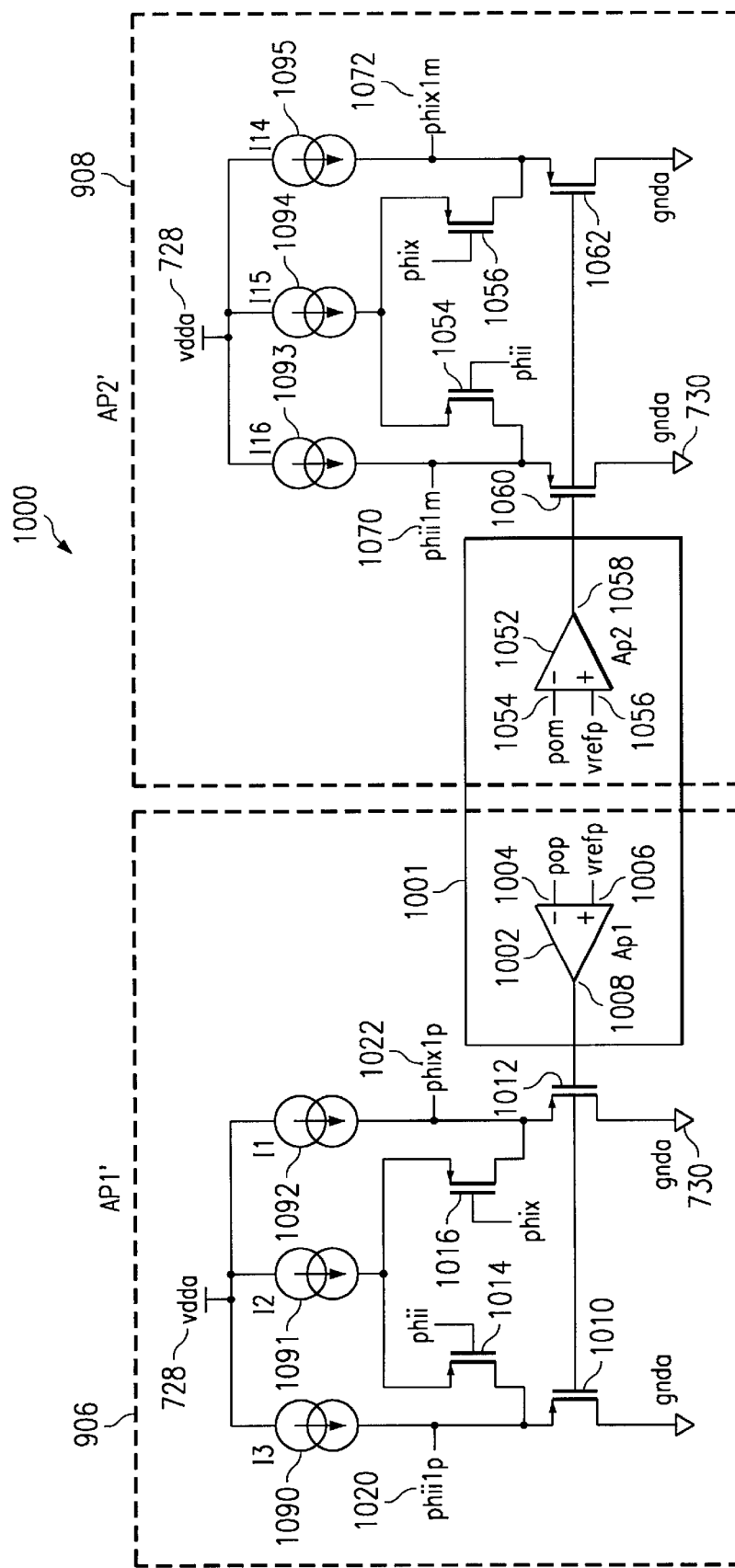
FIG. 10 is a schematic diagram showing the upper or "p" portion of the amplifier of FIG. 9.

FIG. 10 provides a more-detailed circuit diagram of the Ap1' and Ap2' amplifiers 906, 908 of FIG. 9. The Ap1' block 906 is shown on the left side of FIG. 10, and this block includes amplifier Ap 11002, which receives the "pop" signal 936 and the Vrefp reference voltage 942. The Ap1 amplifier 1002 provides the operational amplifier function of the Ap1' block 906 as it was described with respect to FIG. 9 (i.e., maintaining equal voltages at the inputs 1004, 1006). The output of the amplifier Ap1 1002 drives the gates of the transistors 1010, 1012, which amplifies the signal output 1008 of Ap1 at output phii1p or phii1p (1020,1022), depending on the as phase of the chopper clock. The switching of current based on the chopper clock is accomplished by the phii and phix signals, through transistors 1014, 1016. To allow further amplification with transistors M1 and M5 (not shown, see FIG. 9), the phii1p and phix1p signals are generated as analog clock signals centered about the Vrefp voltage and amplified by Ap1 1002. The operation of the Ap2' block 908 is analogous to the operation of the Ap1' block 906, ultimately providing the amplified, biphasic signals phii1m and phix1m signals (1070, 1072) to transistors M3 and M7, respectively (not shown, see FIG. 9). Certain design efficiencies can be accomplished by combining the circuitry design for the Ap1 amplifier and the Ap2 amplifier into a common circuit block 1001.

Figure 11A:
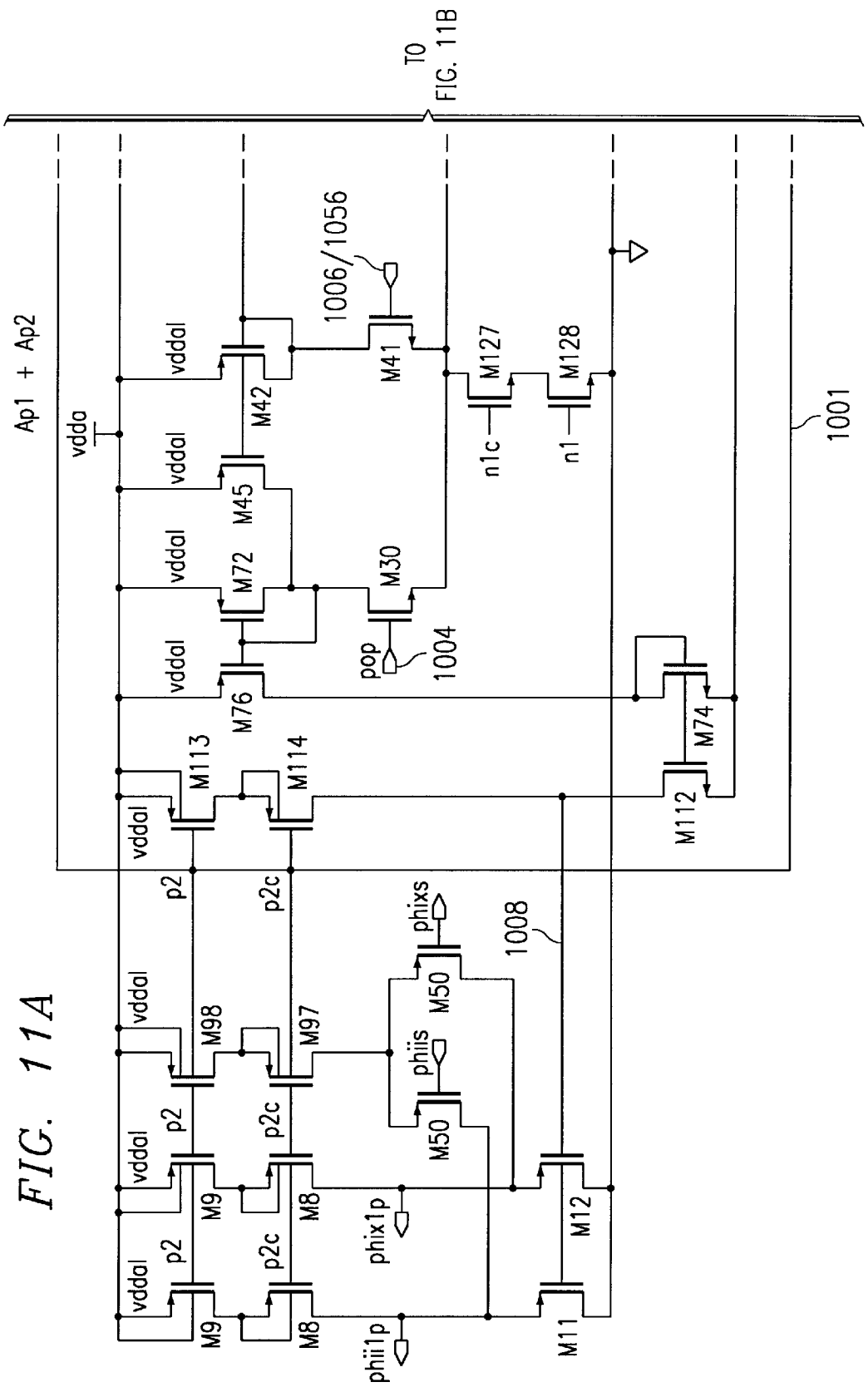
FIGS. 11A and 11B are a more detailed schematic diagrams which may be used to implement the circuitry of FIG. 10.
Figure 11B:
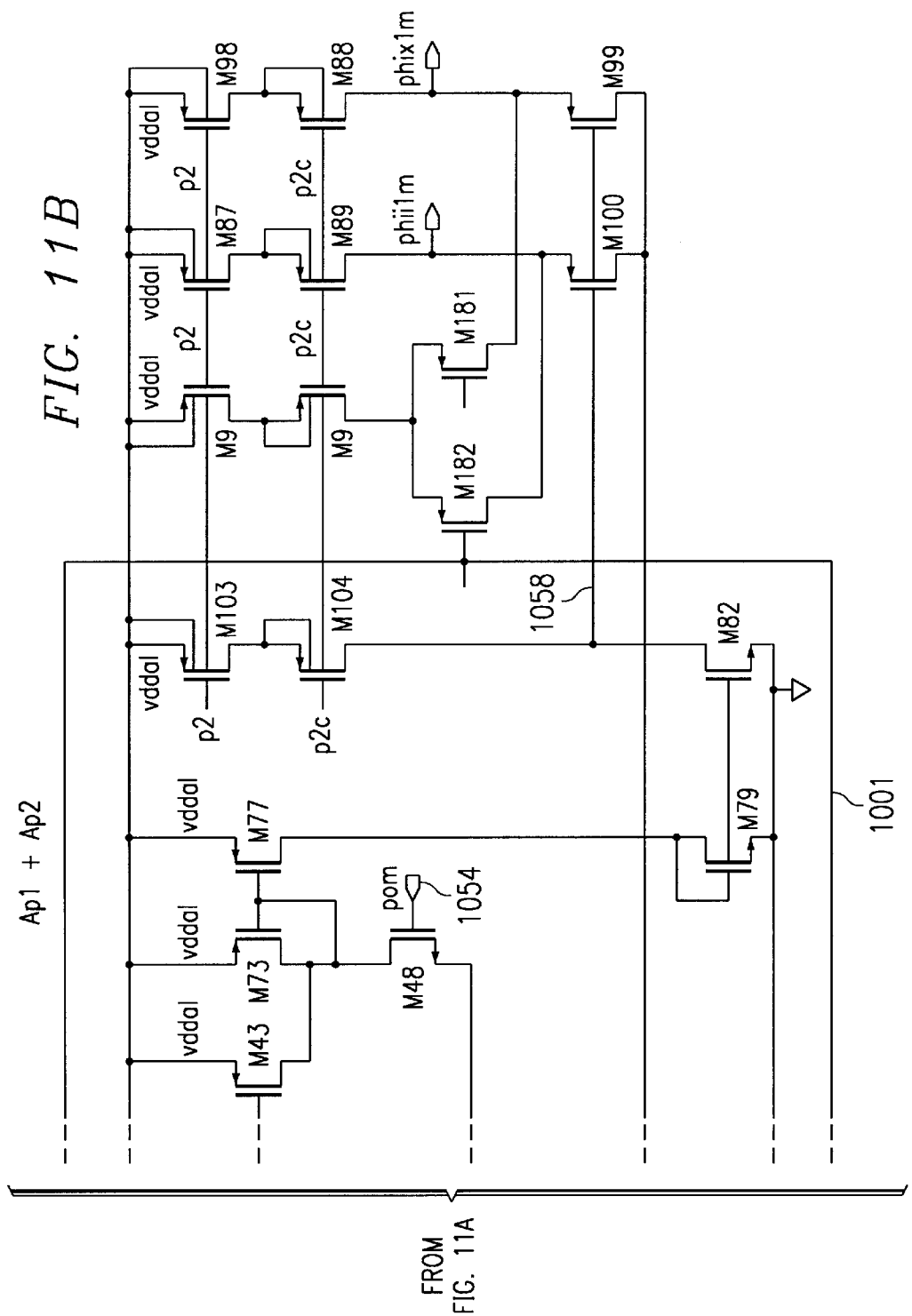

FIG. 11 is a transistor-level schematic of one way to implement the circuit of FIG. 10. In FIG. 11, circuitry for implementing the Ap1 and Ap2 amplifiers has been designed in a single circuit block 1001. Within the circuit block 1001, commonalties between the Ap1 and Ap2 amplifiers are exploited to reduce the amount of circuitry required to implement the circuit. Specifically there are common transistors for handling the Vrefp reference voltage to the separate amplifiers. These common transistors comprise M41, M42, M127, and M128. The circuitry to the left of these common transistors within the circuit block 1001 is the circuitry for the Ap1 amplifier 1002; the circuitry to the right of these common transistors is the circuitry for the Ap2 amplifier 1052.

Regarding the Ap1 amplifier 906, the "pop" signal is received at the gate of transistor M39. The remaining transistors within amplifier 906 amplify the input signals, which are the "pop" voltage 1004 and the Vrefp voltage (1006/1056), to provide output signal 1008. Transistors M39, M45, M72, M74, M76 provide a differential amplifier for the "pop" and the Vrepf inputs. Transistors M112, M113, and M114 provide the output stage of the Ap1 amplifier 906, outputting the amplified signal 1008. The circuitry to the left of the circuit block 1001 corresponds generally with the circuit elements to the left of that circuit block in FIG. 10. Thus, transistor M11 and M12 correspond with transistors 1010 and 1012 in FIG. 10; transistors M60 and M58 correspond with transistors 1014 and 1016; transistors M91 and M92 correspond with current source I3 (1090); transistors M94 and M95 correspond with current source I2 (1091); and transistors M96 and M97 correspond with current source I1 (1092).

Regarding the Ap2 amplifier 908, transistor M48, the "pom" signal 1054 is received at the gate of the transistor M48. Within this amplifier 908, transistors M43, M48, M73, M77, and M79 comprise a differential amplifier for the inputs "pom" and Vrefp (1054, 1006/1056). An output amplifier stage is provided by transistors M62, M163, and M164. The circuitry to the right of the circuit block 1001 corresponds generally with the circuit elements to the right of that circuit block in FIG. 10. Thus, transistor M100 and M99 correspond with transistors 1060 and 1062 in FIG. 10; transistors M162 and M161 correspond with transistors 1054 and 1066; transistors M95 and M96 correspond with current source I16 (1093); transistors M87 and M89 correspond with current source I15 (1094); and transistors M98 and M88 correspond with current source I14 (1095).

Figure 12:
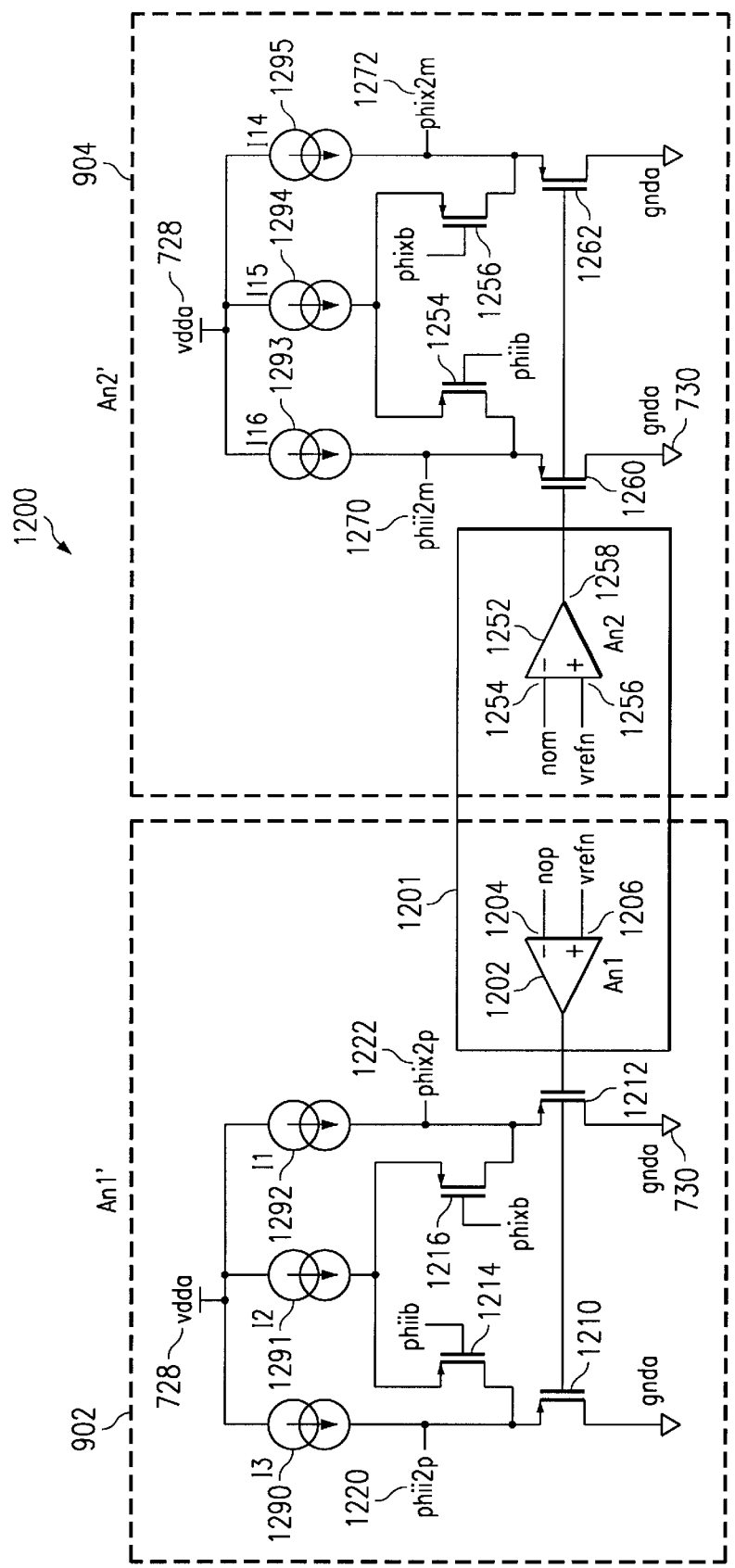
FIG. 12 is a schematic diagram generally showing the circuitry of the bottom or "n" portion of the schematic shown in FIG. 9.

FIG. 12 provides a more-detailed circuit diagram of the An1' and An2' amplifiers 902, 904 of FIG. 9. The An1' block 902 is shown on the left side of FIG. 10, and this block includes amplifier An1 1202, which receives the "nop" signal 930 and the Vrefn reference voltage 940. The An1 amplifier 1202 provides the operational amplifier function of the An1' block 902 as it was described with respect to FIG. 9 (i.e., maintaining equal voltages at the inputs 1204, 1206). The output of the amplifier An1 1202 drives the gates to the transistors 1210, 1212, which amplifies the signal output 1208 of An1 at output phii2p or phix2p (1220, 1222), depending on the phase of the chopper clock. The switching of current based on the chopper clock is accomplished by the phii and phix signals, through transistors 1214, 1216. To allow further amplification with transistors M2 and M6 (not shown, see FIG. 9), the phii2p and phix2p signals are generated as analog clock signals centered about the Vrefn voltage and amplified by An1 1202. The operation of the An2' block 904 is analogous to the operation of the An1' block 902, ultimately providing the amplified, biphasic signals phii2m and phix2m signals (1270, 1272) to transistors M4 and M8, respectively (not shown, see FIG. 9). Certain design efficiencies can be accomplished by combining the circuitry design for the An1 amplifier and the An2 amplifier into a common circuit block 1201.

Figure 13A:
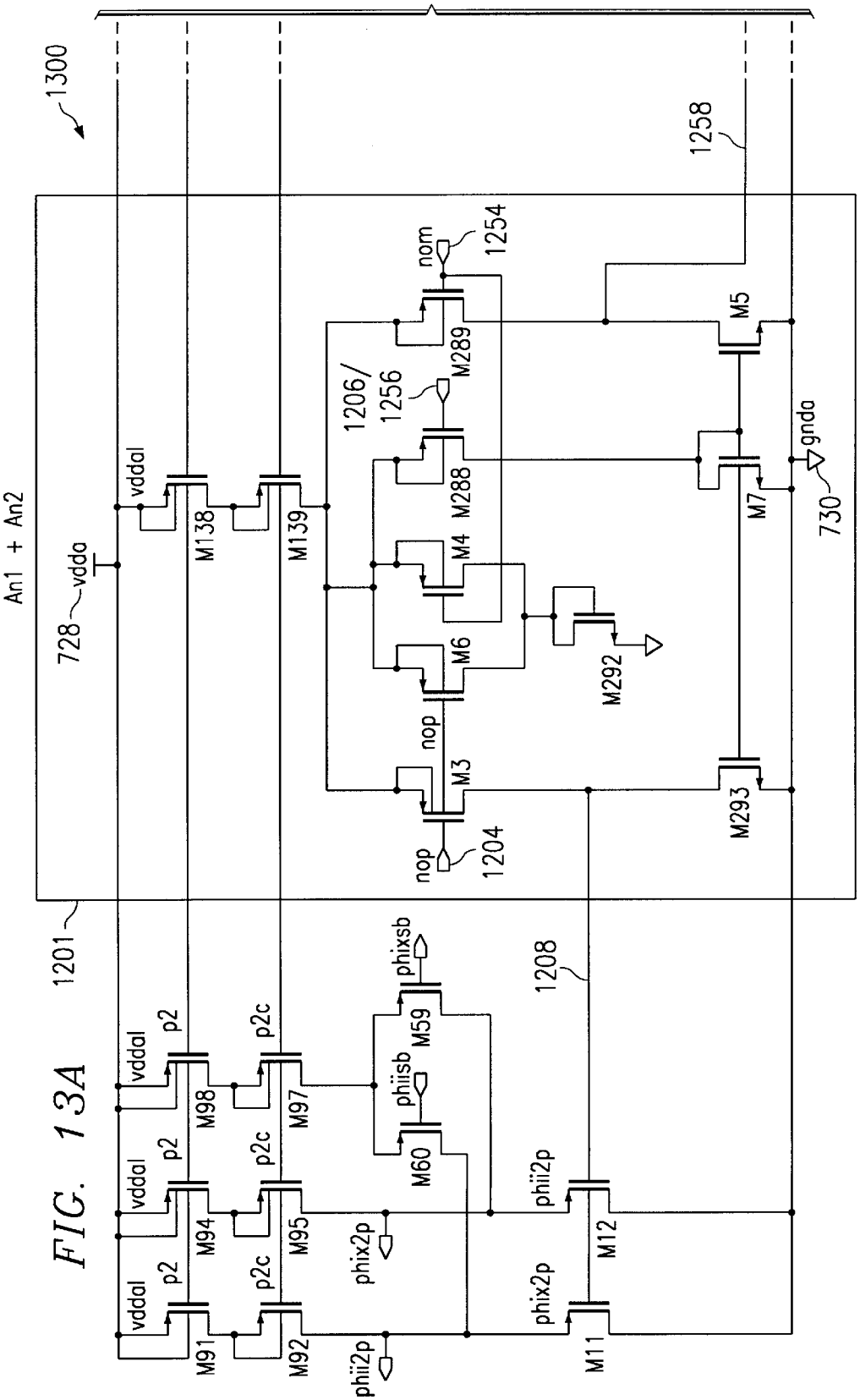

FIG. 13 is a transistor-level schematic of one way to implement the circuit of FIG. 12. In FIG. 13, circuitry for implementing the An1 and An2 amplifiers has been designed in a single circuit block 1201. Within the circuit block 1201, commonalties between the An1 and An2 amplifiers are exploited to reduce the amount of circuitry required to implement the circuit. Specifically there are common transistors for handling the Vrefp reference voltage to the separate amplifiers. These common transistors comprise of M7, M138, M139, and M288. The circuitry to the left of these common transistors within the circuit block 1201 is the circuitry for the An1 amplifier 1202; the circuitry to the right of these common transistors is the circuitry for the An2 amplifier 1252.

Regarding the An1 amplifier 902, the "nop" signal is received at the gate of transistor M3. The remaining transistors within amplifier 902 amplify the input signals, which are the "nop" voltage 1204 and the Vrefn voltage (1206/1256), to provide output signal 1208. Transistors M3, M4, M6, M288, M292 provide a differential amplifier for the "nop" and the Vrefn inputs. Transistor M293 provides the output stage of the An1 amplifier 902, outputting the amplified signal 1208. The circuitry to the left outside of the circuit block 1201 corresponds generally with the circuit elements to the left of that circuit block in FIG. 12. Thus, transistors M11 and M12 correspond with transistors 1210 and 1212 in FIG. 12; transistors M60 and M59 correspond with transistors 1214 and 1216; transistors M91 and M92 correspond with current source I3 (1290); transistors M94 and M95 correspond with current source I2 (1291); and transistors M97 and M98 correspond with current source I1 (1292).

Regarding the An2 amplifier 904, the "nom" signal 1254 is received at the gate of the transistor M289. Within this amplifier 904, transistors M4, M5, M7, M288, and M289 comprise a differential amplifier for the inputs "nom" and Vrefn (1254, 1206/1256). An output amplifier stage is provided by transistor MS. The circuitry to the right of the circuit block 1201 corresponds generally with the circuit elements to the right of that circuit block in FIG. 12. Thus, transistor M32 and M33 correspond with transistors 1260 and 1262 in FIG. 12; transistors M24 and M25 correspond with transistors 1254 and 1256; transistors M29 and M31 correspond with current source I16 (1293); transistors M26 and M27 correspond with current source I15 (1294); and transistors M28 and M30 correspond with current source I14 (1295).

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention. Clock signals ranging over a subset of the power supply voltages for the amplifier circuits are referred to above as "analog" clock signals, even though as described above such clock signals still are two-voltage-level signals. Describing such clock signals as "analog" should not limit the scope of the claims beyond the limitations set forth explicitly in the claims below.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware. Summers can be implemented using operational amplifiers, wired connections, passive devices, electro-optic devices, integrated optic devices, acousto-optic devices or other implementations. Amplifiers can be discrete transistor amplifiers, operational amplifiers, optical amplifiers, traveling-wave-tube amplifiers, RF amplifiers, or other implementations. References in the claim preamble to "operational amplifiers," and elements in the claims where "operational amplifier" is a label preceding other elements should thus be construed broadly to cover other types of amplifiers, as the term "operational amplifier" has been used herein to distinguish from single-element amplifiers and thus to refer to any amplifier which may have subsidiary amplifying elements.

Bypass paths include hard-wired connections, RF connections, acoustic Woo connections, or optical connections, and may include other elements interposed in the bypass paths. A given amplifier stage can include one or more than one sub-stages and/or one or more amplifying elements. A connection between amplifier stages or between other elements can include additional amplifiers or filtering elements, and therefore connections between elements recited in this application shall be inclusive of connections having additional elements interposed between such elements.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier circuit comprising:

a) a first amplifier sub-circuit having a signal input and a clock input, said signal input operable to receive an input signal, and said clock input operable to receive a clock signal, said first amplifier sub-circuit operable to generate first and second output signals, each output signal including a clock component based on said clock signal input;

b) a second amplifier sub-circuit having an input connected to said first output signal, a feedback path connected to said input signal, and an output, said second amplifier sub-circuit operable to be turned off when said clock component is in a first condition and to collectively form a gain-boosted cascode amplifier with said first sub-circuit to provide an amplified signal at its output when said clock component is in a second condition; and c) a third amplifier sub-circuit having an input connected to said second output signal, a feedback path connected to said input signal, and an output, said third amplifier sub-circuit operable to be turned off when said clock component is in said second condition and to collectively form a gain-boosted cascode amplifier with said first sub-circuit to provide an amplified signal at its output when said clock component is in said first condition.

2. The amplifier circuit of claim 1 wherein said first amplifier sub-circuit is an operational amplifier.

3. The amplifier circuit of claim 1 wherein each of said second and third amplifier sub-circuits are transistor circuits.

4. The amplifier circuit of claim 3 wherein each of said transistor circuits comprises multiple transistors.

5. The amplifier circuit of claim 3 wherein each of said transistor circuits consists of single transistors.

6. The amplifier circuit of claim 1 wherein said at least one transistor amplifier comprises more than one transistor.

7. The amplifier circuit of claim 1 wherein said clock component comprises non-overlapping clock signals on said first and second outputs, whereby a first clock signal is provided on said first output and a second clock signal is provided on said second output, and wherein said clock signals are approximately non-overlapping.

8. The amplifier circuit of claim 1 wherein the voltages of said clock component is such that when said second and third amplifier sub-circuits are substantially not saturated, whereby said second and third amplifiers are operating in a substantially in linear mode.

9. The amplifier of claim 1 wherein said amplifier is connected to a positive and a negative supply rail, and wherein said second and third sub-circuits each comprise at least one transistor amplifier and wherein said clock component oscillates over a voltage range that lies substantially within said positive and negative supply rails.

10. The amplifier circuit of claim 9 wherein the range of said output voltage of said second and third sub-circuits includes an output voltage that is removed from one of said positive and negative supply rails by less than three $V_{DS}$ voltage drops of a MOS transistor.

11. The amplifier circuit of claim 1 wherein said clock component is derived from said chopper clock signal.

12. A chopper stabilized amplifier comprising:
a) first and second differential voltage inputs;
b) an input chopper switch having a chopper clock signal input, having inputs connected to said first and second differential voltage inputs, and providing first and second signal path outputs, said input chopper switch operable during one phase of said chopper clock signal to connect said first differential voltage input to said first signal path output and said second differential voltage input to said second signal path output, and during the other phase of said chopper clock signal to connect said second differential voltage input to said first signal path output and said first differential voltage input to said second signal path output;
c) at least one current-steering amplifier connected to each of said first and second signal path outputs, each of said current-steering amplifiers comprising:
   i) a first amplifier sub-circuit having a signal input for receiving the signal from the respective first or second signal path output and a clock input for receiving a clock signal based on said chopper clock, said first amplifier sub-circuit operable to generate first and second output signals, each output signal including a clock component based on said clock signal input;
   ii) a second amplifier sub-circuit having a signal input connected to said first output signal from said first amplifier sub-circuit, a feedback path connected to said signal input, and an output, said second amplifier sub-circuit operable to be turned off when said clock component is in a first condition and to collectively form a cascode amplifier with said first sub-circuit to provide an amplified signal at its output when said clock component is in a second condition; and
   iii) a third amplifier sub-circuit having an input connected to said second output signal from said first amplifier sub-circuit, a feedback path connected to said signal input, and an output, said third amplifier sub-circuit operable to be turned off when said clock component is in said second condition and to collectively form a cascode amplifier with said first sub-circuit to provide an amplified signal at its output when said clock component is in said first condition.

13. The amplifier of claim 12 wherein said current-steering amplifier is connected to a positive and a negative supply rail, and wherein said second and third sub-circuits each comprises at least one transistor amplifier and wherein said clock component oscillates over a voltage range that lies substantially within said positive and negative supply rails.

14. The amplifier circuit of claim 13 wherein the range of said output voltage of said second and third sub-circuits includes an output voltage that is removed from one of said positive and negative supply rails by less than three $V_{DS}$ voltage drops of a MOS transistor.

15. The amplifier circuit of claim 12 wherein further circuitry is interposed between said input chopper switch and said at least one current-steering amplifier.

16. The amplifier circuit of claim 12 wherein said clock component is derived from said chopper clock signal.

17. The amplifier circuit of claim 12 wherein said second and third sub-circuits each comprise at least one transistor amplifier.

18. The amplifier circuit of claim 17 wherein said at least one transistor amplifier comprises multiple transistors.

19. The amplifier circuit of claim 17 wherein said at least one transistor amplifier consists of a single transistor.

* * * * *